(12) United States Patent
Kwon et al.

(10) Patent No.: US 6,319,019 B1
(45) Date of Patent: Nov. 20, 2001

(54) SELECTIVELY REINFORCED FLEXIBLE TAPE CARRIER PACKAGES FOR LIQUID CRYSTAL DISPLAY MODULES

(75) Inventors: Gong-sub Kwon; Won-ho Kang, both of Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/188,512

(22) Filed: Nov. 9, 1998

(30) Foreign Application Priority Data

Dec. 31, 1997 (KR) .................................................. 97-79902

(51) Int. Cl.<sup>7</sup> ............................... H01R 12/00; H05K 1/00
(52) U.S. Cl. ........................ 439/67; 174/117 FF; 361/749
(58) Field of Search ........................ 439/67; 174/117 FF, 174/255, 254, 250; 361/749, 751

(56) References Cited

U.S. PATENT DOCUMENTS

| | | | |
|---|---|---|---|
| 4,635,359 | * 1/1987 | Nozick | ................................... 29/878 |
| 5,274,195 | * 12/1993 | Murphy et al. | ................. 174/117 FF |
| 5,362,547 | * 11/1994 | Yamazaki | .............................. 428/167 |
| 5,844,783 | * 12/1998 | Kojima | .................................. 361/777 |
| 5,936,850 | * 8/1999 | Takahashi et al. | ..................... 361/784 |
| 5,970,608 | * 10/1999 | Tighe et al. | ............................. 29/843 |
| 5,975,944 | * 11/1999 | Medina et al. | ........................ 439/493 |

* cited by examiner

*Primary Examiner*—Lincoln Donovan
*Assistant Examiner*—Kyung S. Lee
(74) *Attorney, Agent, or Firm*—Myers Bigel Sibley & Sajovec

(57) ABSTRACT

The flexible tape carrier package of an LCD module is selectively reinforced so as to reduce damage in the conductive leads thereof when a microelectronic substrate such as a printed circuit board is suspended from an LCD panel by the tape carrier package. The flexible tape carrier package is preferably selectively reinforced by integrating at least two of the conductive leads along at least one selected portion of the tape carrier package between the first and second end portions thereof. Accordingly, by selectively reinforcing the flexible tape carrier package, fracturing and/or cracking of the conductive lines during LCD module manufacture and transport may be reduced.

16 Claims, 3 Drawing Sheets

SELECTIVELY REINFORCED FLEXIBLE TAPE CARRIER PACKAGES FOR LIQUID CRYSTAL DISPLAY MODULES

FIELD OF THE INVENTION

This invention relates to liquid crystal display modules, and more particularly to liquid crystal display modules that include a flexible tape carrier package that connects a liquid crystal display panel to a microelectronic substrate such as a printed circuit board.

BACKGROUND OF THE INVENTION

Liquid Crystal Displays (LCDs) are widely used flat panel displays. As is well known to those having skill in the art, an LCD panel generally includes a thin film transistor substrate, a color filter substrate that is spaced apart from the thin film transistor substrate and a liquid crystal material between the thin film transistor substrate and the color filter substrate.

An LCD module generally includes an LCD panel and a microelectronic substrate such as a Printed Circuit Board (PCB). The PCB may include a timing controller and various other integrated circuit components thereon. The PCB and the LCD panel may be interconnected by a flexible Tape Carrier Package (TCP).

FIG. 1 illustrates a conventional TCP. As shown, the TCP 12 includes a flexible base film including first and second opposing end portions that attach to the LCD panel and to the PCB, respectively. A plurality of conductive leads 20 are also included that extend to the first and second end portions to electrically connect to the LCD panel and to the PCB, respectively. One or more integrated circuits 30 is also included and electrically connected to at least some of the conductive leads 20.

The conductive leads are formed at both end portions of the flexible base film 10. The conductive leads 10 may include common signal leads 21 that are at the outermost portion of the flexible base film 10, dummy leads 23 that are inward from the common signal leads 21, and input/output leads 27 and 25 that are inward of the dummy leads 23. Common signals are transmitted to the LCD panel and the PCB through the common signal leads 21. Signals are not generally provided on dummy leads 23. Image signals are input to the input leads 27 and output from the output leads 25.

In order to form an LCD module, an Anisotropic Conductive Film (ACF) is placed on the input pads of the LCD panel. The output leads 25 of the TCP 12 are aligned to the input pads of the LCD panel. The TCP 12 is then heat pressed and attached to the LCD panel using the ACF. Then, output pads on the PCB are aligned to the input leads 27 of the TCP 12. The TCP 12 is then connected to the PCB by soldering. Alternatively, the TCP 12 may be connected to the PCB using ACF.

During the manufacture of LCD modules, operators and/ or equipment may transfer the LCD module by holding the LCD panel. This folds the TCP 12 downwardly due to the weight of the PCB so that the PCB is suspended from the LCD panel by the TCP 12. Unfortunately, however, when the LCD panel is transferred and/or handled by holding only the LCD panel, the portion of the TCP 12 that is not attached to the LCD panel and the PCB may be twisted due to the movement of the suspended PCB. As a result, the common signal leads and the dummy leads that are formed at the outer portion of the TCP may undergo severe mechanical stress and may even fracture due to fatigue. Moreover, one or more of the input/output leads may crack so that electrical signals that are transmitted therethrough may be degraded.

SUMMARY OF THE INVENTION

It is therefore an object of the present invention to provide improved LCD modules including improved tape carrier packages that connect the LCD panel thereof to the microelectronic substrate thereof.

It is another object of the present invention to provide LCD modules that can reduce the occurrence of fatigue related fractures and/or cracks in the conductive lead of a tape carrier package that connects an LCD panel to a microelectronic substrate.

These and other objects are provided, according to the present invention, by selectively reinforcing the flexible tape carrier package so as to reduce damage in the conductive leads thereof when a microelectronic substrate such as a printed circuit board is suspended from an LCD panel by the tape carrier package. In a preferred embodiment of the invention, the flexible tape carrier package is selectively reinforced by integrating at least two of the conductive leads along at least one selected portion of the tape carrier package between the first and second end portions thereof. Accordingly, by selectively reinforcing the flexible tape carrier package, fracturing and/or cracking of the conductive lines during LCD module manufacture and transport may be reduced.

More specifically, flexible tape carrier packages according to the invention connect an LCD panel to a microelectronic substrate such as a printed circuit board to form an LCD module. The flexible tape carrier package comprises a flexible base film that includes first and second opposing end portions that attach to the LCD panel and to the printed circuit board, respectively, and a plurality of conductive leads that extend to the first and second end portions to electrically connect to the LCD panel and to the printed circuit board, respectively. Flexible tape carrier packages according to the invention also include means for selectively reinforcing the flexible tape carrier package so as to reduce damage in the conductive leads when the printed circuit board is suspended from the LCD panel by the tape carrier package.

The means for selectively reinforcing preferably comprises means for integrating at least two of the conductive leads along at least one selected portion of the tape carrier package between the first and second end portions thereof. It will be understood, however, that other means for selectively reinforcing may be provided. For example, another layer may be added to the flexible base film at the at least one selected portion. Alternatively, reinforcing members may be added within the flexible base film at the at least one selected portion. Other reinforcing structures may also be provided.

In one embodiment of the present invention, the plurality of conductive leads comprises a plurality of common signal leads, a plurality of dummy leads and a plurality of input/ output leads. At least two of the common signal leads are integrated along the at least one selected portion of the tape carrier package. Alternatively, at least two of the dummy leads may be integrated along the at least one selected portion. Common signal leads and dummy leads also may be integrated.

The flexible base film preferably includes a window in the first end portion and a folded portion that is spaced apart from the window and that folds when the printed circuit board is suspended from the LCD panel by the tape carrier package. The at least one selected portion is preferably located between the window and the folded portion.

Flexible tape carrier packages according to the invention may be combined with an LCD panel and a microelectronic substrate such as a printed circuit board to provide improved LCD modules. The LCD modules can reduce damage in the conductive leads of the flexible tape carrier package when the printed circuit board is suspended from the LCD panel by the tape carrier package. Improved reliability and/or yield and/or performance may thereby be obtained.

DETAILED DESCRIPTION OF PREFERRED EMBODIMENTS

Figure 1:
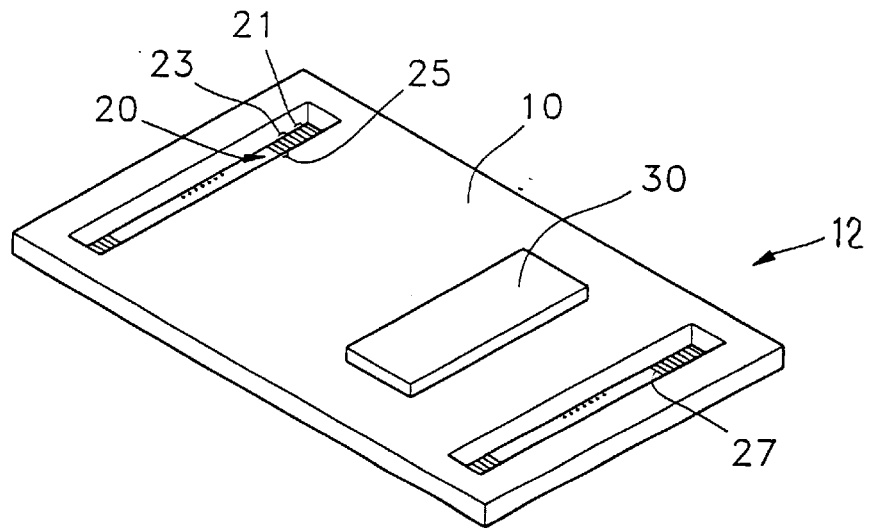
FIG. 1 is a schematic perspective view of a conventional Tape Carrier Package (TCP).

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 5:
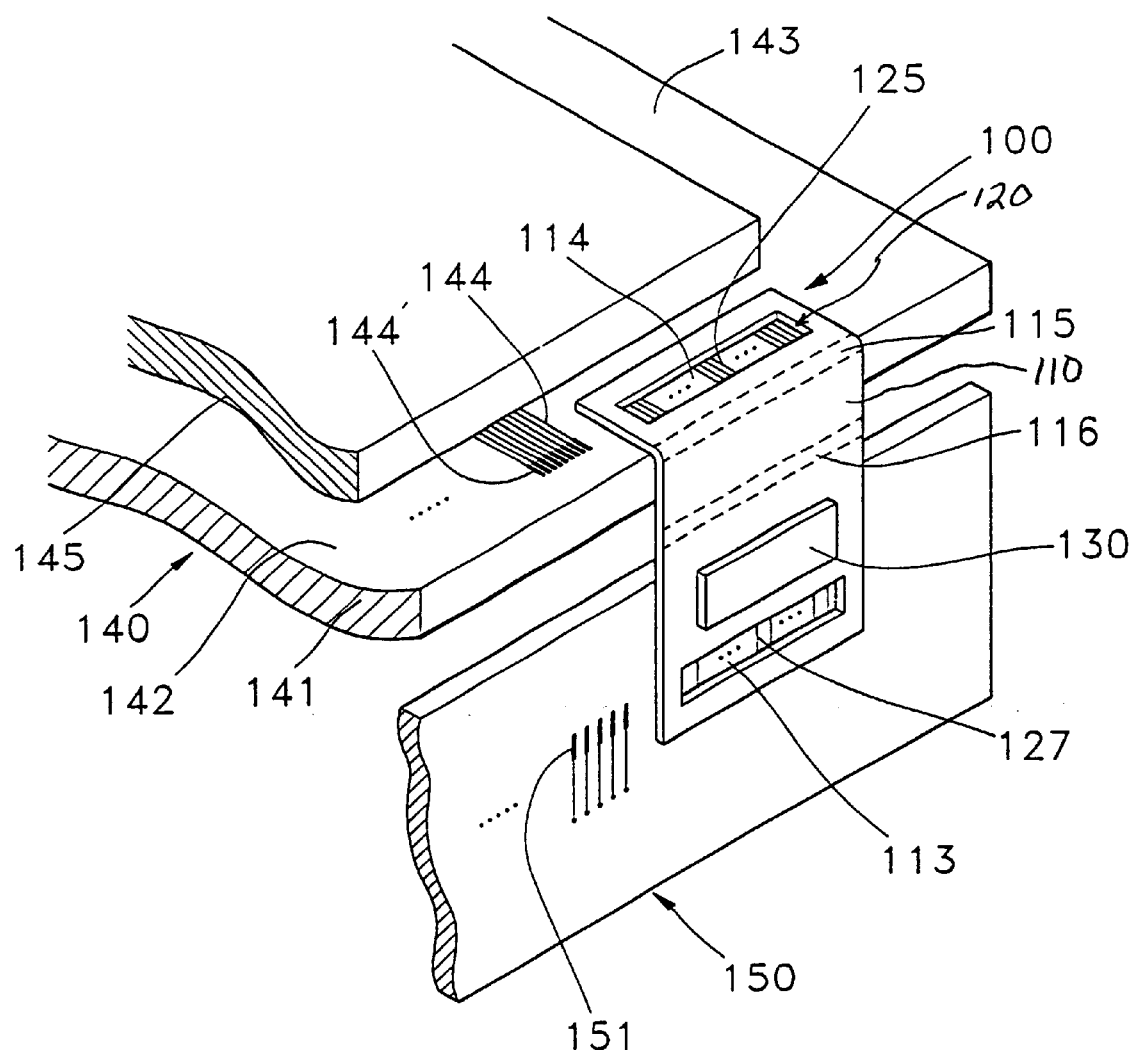
FIG. 5 is a schematic perspective view of an LCD panel and a printed circuit board interconnected by a TCP according to the present invention.

Referring first to FIG. 5, LCD modules according to the invention will first be described. As shown in FIG. 5, LCD modules according to the invention include an LCD panel 140, a microelectronic substrate such as a Printed Circuit Board (PCB) 150 and a flexible tape carrier package 100 that connects the LCD panel 140 to the PCB 150.

The LCD panel 140 includes a thin film transistor substrate 141 and a color filter substrate 145. A plurality of gate lines 144 extend in a first direction, for example horizontally, to a gate area 142, and a plurality of data lines extend in a second direction, for example vertically, to a data area 143. For simplification, the data lines are not illustrated. It also will be understood that these directions may be reversed. The gate lines 144 and the data lines intersect each other, preferably orthogonally. Gate pads and data input pads 144' are formed at respective ends of the gate lines 144 and the data lines. For simplification, the data pads are not illustrated. Signals are input to the gate input pads 144' and the data input pads.

The PCB is preferably a multi-layered, relatively inflexible microelectronic substrate including output pads 151 at respective ends near the gate and data areas 142 and 143 of the TFT substrate. It will be understood that other microelectronic substrates may be used.

The TCP 100 includes a flexible base film 110 that includes first and second opposing end portions that attach to the LCD panel 140 and to the printed circuit board 150, respectively. A plurality of conductive leads 120 are included in or on the base film 110. The conductive leads 120 transmit electrical signals therethrough. An integrated circuit such as a driving integrated circuit 130 is electrically connected to the conductive leads 120 to thereby drive the LCD panel 120.

An output window 114 is preferably included in the first end portion of the TCP 100. An input window 113 is preferably included in the second end portion of the TCP 150. The output window 114 may be used for alignment of the gate input pads 144' to the conductive leads 120 in the TCP. The input window 113 may be used to align the output pads 151 to the conductive leads 120 in the TCP 100. First and second folded portions 115 and 116 are also formed between the output window 114 and the driving integrated circuit 130 by folding the TCP 100 to place the PCB 150 under the LCD panel 140.

The conductive leads 120 generally include common signal leads through which common signals are transmitted to the LCD panel 140 and to the PCB 150. Dummy leads are also generally included, through which no signals are transmitted. Input/output leads 127 and 125 respectively are also generally included, through which image signals are output from the PCB 150 and input into the LCD panel 140.

The portion of the TCP 100 between the first end that is connected to the LCD panel 140 and the driving integrated circuit 130 will be referred to herein as an output portion. The portion thereof between the driving integrated circuit 130 and the second end portion connected to the PCB 150 will be referred to as an input portion.

Figure 2:
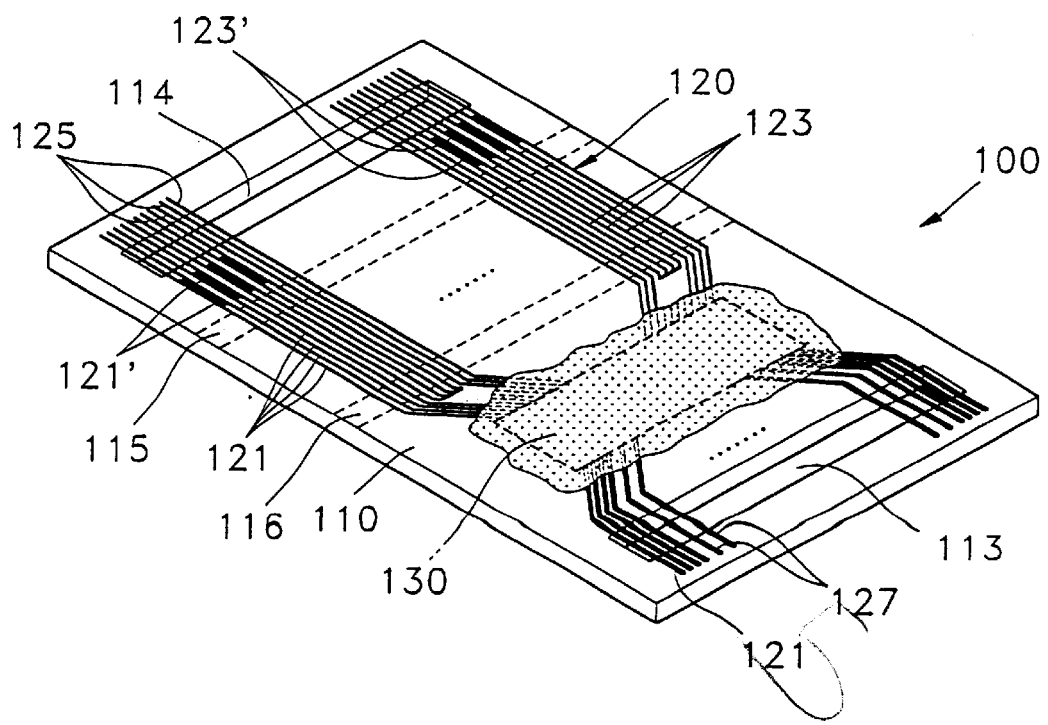
FIG. 2 is a schematic perspective view of a TCP according to a first embodiment of the present invention.

Referring now to FIG. 2, a first embodiment of TCP 100 according to the present invention is illustrated. As shown in FIG. 2, at least two of the common signal leads 121 are integrated along at least one selected portion of the tape carrier package, between the first and second end portions thereof. More specifically, as shown in FIG. 2, at least two of the common signal leads 121 are integrated in a selected portion of the tape carrier package between the output window 114 and the first folded portion 115.

Even more specifically, a plurality of reinforced common signal lead units 121' are formed between the output window 114 and the first folded portion 115 by integrating at least two of the common signal leads 121 therebetween. Since the common signal leads 121 may have a width of approximately 70 $\mu$m and the space between the common signal leads 121 may be approximately 70 $\mu$m, the width of the reinforced common signal lead unit 121' may be 210$\mu$m when the two common signal leads 121 are integrated.

As also shown in FIG. 2, at least two of the dummy leads 123 are also integrated. As shown in FIG. 2, the common signal leads 121 are generally the outermost leads in the TCP 100 and the dummy leads 123 extend along the TCP 100, inwardly from the common signal leads 121. Moreover, as also shown, the dummy leads may only be formed in the output portion of the TCP 100.

In particular, a reinforced dummy lead unit 123' is formed between the output window 114 and the first folded portion 115 by integrating at least two of the dummy leads 123 therebetween. It will be understood that although FIG. 2 illustrates integrated common signal leads 121' and integrated dummy leads 123', only one of the groups of leads may be integrated in other embodiments.

The preferred location of the reinforced common signal lead structure 121' and the reinforced dummy lead structure 123' will now be described. As shown in FIG. 2, these integrated lead structures are formed between the output window 114 and the first folded portion 115 because the common signal leads 121 and the dummy leads 123 may be most easily cut between the output window 114 and the first folded portion 115. This region may be most easily cut because stress may be concentrated at the portion of the TCP 100 between the output window 114 and the first folded portion 115, i.e., at the boundary of the portion of the TCP 100 attached to the LCD panel 140 using ACF and the portion of the TCP 100 that is not attached to the LCD panel 140.

Figure 3:
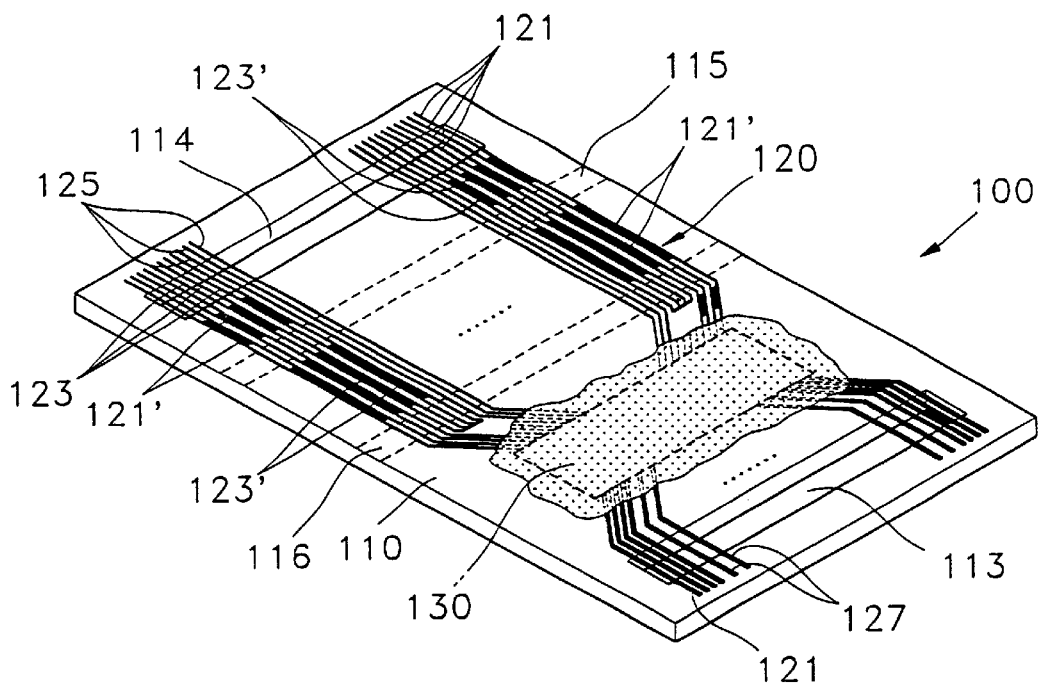
FIG. 3 is a schematic perspective view of a TCP according to a second embodiment of the present invention.

FIG. 3 illustrates a second embodiment of TCPs according to the invention. In this embodiment, the reinforced common signal lead unit 121' and the reinforced dummy lead unit 123' are formed in the entire area of the TCP between the output window 114 and the driving integrated circuit except for the first and second folded portions 115 and 116.

Figure 4:
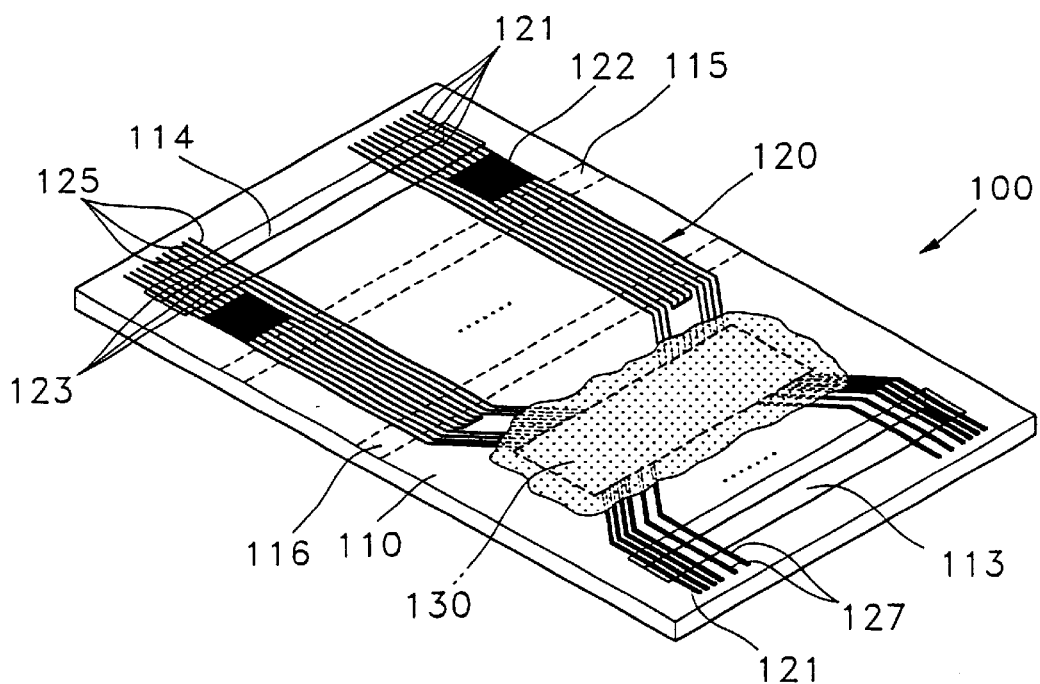
FIG. 4 is a schematic perspective view of a TCP according to a third embodiment of the present invention.

FIG. 4 illustrates yet another alternative embodiment wherein common the signal leads 121 and the dummy leads 123 may all be integrated to form a reinforced common signal lead and reinforcing dummy lead structure 122.

The fabrication of the reinforced common signal lead unit 121' and the reinforced dummy lead unit 123' will now be described.

First, a conductive material, such as copper, is coated on the surface of the base film 110. The conductive material is then exposed using a mask. Then, the portion of the exposed conductive material other than the portions thereof that form the common signal leads 121, the dummy leads 123, the input/output leads 127 and 125, the reinforced common signal lead unit 121' and reinforced dummy lead unit 123' are etched and removed. For example, the exposed conductive material may be etched and removed except for the portions thereof that form the common signal leads 121, the dummy leads 123, the input/output leads 127 and 125, and the reinforced common signal lead and dummy lead units 121' and 123' between the output window 114 and the first folded portion 115.

For the following description, only the portion between the driving integrated circuit 130 and the first end of the TCP 100 connected to the LCD panel 140 will be described. When the conductive material is removed by etching, a plurality of spaced apart input/output leads 127 and 125 are formed on the base film 110 and a plurality of spaced apart common signal leads 121 and dummy leads 123 are formed on the base film except for the area between the output window 114 and the first folded portion 115.

As a result, in the unetched portion, i.e., the portion between the output window 114 and the first folded portion 115, the common signal leads 121 and the dummy leads 123 are not spaced apart. Rather, the reinforced common signal lead unit 121' and the reinforced dummy lead unit 123', are formed.

The etching also preferably forms a plurality of input leads 127 inwardly from the common signal leads 121, preferably at the same pitch as the output pads 151, and extending from the driving integrated circuit 130 to the second end of the TCP 100 connected to the PCB 150. In addition, the etching also preferably forms a plurality of output leads 125 inwardly from the dummy leads 123. The output leads 125 extend from the first end portion of the TCP 100 that is attached to the LCD panel 140, to the driving integrated circuit 130. The pitch between the output leads 125 is preferably the same as the pitch between the gate input pads 144', and preferably smaller than the pitch between the input leads 127.

Interconnection of the LCD panel and the PCB to the TCP will now be described. First, an ACF is attached to the gate input pads 144' of the LCD panel 140. The output leads 127 of the TCP 100 are aligned to the gate input pads 144'. The TCP is then heat pressed and attached to the LCD panel 140. The ACF may be used to attach the LCD panel 140 to output leads 127 of the TCP 100 because the LCD panel 140 is glass and the pitches between the gate input pads 144' are minute, for example less than approximately 0.1 mm.

After the LCD panel 140 and the first end of the TCP 100 are interconnected, the input leads 127 of the TCP 100 are aligned to the output pads 151 of the PCB 150. Then, the TCP 100 may be attached to the PCB 150 by soldering. Alternatively, when the input leads 125 of the TCP 100 and the output pads 151 of the PCB 150 are minute, the TCP 100 may be attached to the PCB 150 using ACF.

After the LCD panel 140 and the PCB 150 are interconnected by the TCP 100, the assembly of the LCD panel 140, the TCP 100 and the PCB 150 may be transferred by holding the LCD panel 140. As already described, the TCP 100 is folded downwardly due to the weight of the PCB 150.

Due to the flexibility of the TCP 100, the PCB 150 may sway back and forth. A portion of the TCP 100 that is not attached to the LCD panel 140 or to the PCB 150 may twist due to swaying of the PCB 150. As a result, the common signal leads 121 formed at edge portions of the TCP 100 in the width direction may undergo mechanical stress and may become cracked. More specifically, when the TCP 100 is twisted, the common signal leads 121 and the output leads 125 between the output window 114 and the first folded portion 115 may be stressed and cracked. In a severe case, the output leads 125 may also crack.

However, according to the present invention, the reinforced common signal leads unit 121' and the reinforced dummy lead unit 123' are formed between the output window 114 and the first folded portion 115. Thus, the widths of the reinforced common signal lead unit 121' and of the reinforced dummy lead unit 123' may be more than three times of the width of the common signal lead 121 or the dummy lead 123. Accordingly, the reinforced units 121' and 123' may not easily crack. Even when the reinforced units 121' and 123' do crack, the common signal leads 121 may not be cracked or cut.

For example, if one of the reinforced common signal lead units cracks, electrical signals may be transmitted to the LCD panel 140 and the PCB 150 through other uncracked reinforced common signal lead unit. Accordingly, it is possible to reduce the likelihood of cutting the common signal leads 121 due to cracking.

In summary, at least two of the plurality of common signal leads and/or dummy leads formed on a TCP are integrated along a predetermined portion thereof. Accordingly, even when the TCP is twisted due to the swaying of the PCB, the common leads and the output leads can be protected from being cut.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A flexible tape carrier package that connects a Liquid Crystal Display (LCD) panel to a microelectronic substrate to form an LCD module, the flexible tape carrier package comprising:

a flexible base film that includes first and second opposing end portions that are configured to attach to the LCD Panel and to the microeletronic substrate, respectively, and a plurality of conductive leads that extended to the first and second end portions, and that are configured to electrically connect to the LCD panel and to the microelectronic substrate, respectively; and means for selectively reinforcing the flexible tape carrier package along at least one selected portion thereof between the first and second opposing end portion;

wherein the means for selectively reinforcing comprises means for electrically connecting at least two of the conductive leads along at least one selected portion of the tape carrier package between the first and second end portions thereof; and wherein the plurality of conductive leads comprise a plurality of common signal leads, a plurality of dummy leads and a plurality of input/output leads, and wherein the means for electrically connecting comprises means for electrically connecting at least two of the common signal leads along at least one selected portion of the tape carrier package between the first and second end portions thereof.

2. A flexible tape carrier package according to claim 1 wherein the flexible base film includes a folded portion that is spaced apart from the first end portion, the at least one selected portion being located between the first end portion and the folded portion and being excluded from the folded portion.

3. A flexible tape carrier package according to claim 1 wherein the flexible base film includes a window in the first end portion and a folded portion that is spaced apart from the window, the at least one selected portion being located between the window and the folded portion and being excluded from the folded portion.

4. A flexible tape carrier package according to claim 1 further comprising at least one integrated circuit on the flexible base film, between the first and second end portions and electrically connected to at least some of the plurality of conductive leads.

5. A flexible tape carrier package that connects a Liquid Crystal Display (LCD) panel to a microelectronic substrate to form an LCD module, the flexible tape carrier package comprising:

a flexible base film that includes first and second opposing end portions that are configured to attach to the LCD panel and to the microelectronic substrate, respectively, and a plurality of conductive leads that extend to the first and second end portions, and that are configured to electrically connect to the LCD panel and to the microelectronic substrate, respectively; and means for selectively reinforcing the flexible tape carrier package along at least one selected portion thereof between the first and second opposing end portions;

wherein the means for selectively reinforcing comprises means for electrically connecting at least two of the conductive leads along at least one selected portion of the tape carrier package between the first and second end portions thereof; and wherein the plurality of conductive leads comprise a plurality of common signal leads, a plurality of dummy leads and a plurality of input/output leads, and wherein the means for electrically connecting comprises means for electrically connecting at least two of the dummy leads along at least one selected portion of the tape carrier package between the first and second end portions thereof.

6. A flexible tape carrier package that connects a Liquid Crystal Display (LCD) panel to a microelectronic substrate to form an LCD module, the flexible tape carrier package comprising:

a flexible base film that includes first and second opposing end portions that are configured to attach to the LCD panel and to the microelectronic substrate, respectively, and a plurality of conductive leads that extend to the first and second end portions, and that are configured to electrically connect to the LCD panel and to the microelectronic substrate, respectively, and a structure that selectively reinforces the flexible tape carrier package along at least one selected portion thereof between the first and second opposing end portions, wherein the structure comprises a conductive pattern that electrically connects at least two of the conductive leads along at least one selected portion of the tape carrier package between the first and second end portions thereof.

7. A flexible tape carrier package according to claim 6 wherein the plurality of conductive leads comprise a plurality of common signal leads, and a plurality of input/output leads, and wherein the structure comprises a conductive pattern that electrically connects at least two of the common signal leads along at least one selected portion of the tape carrier package between the first and second end portions thereof.

8. A flexible tape carrier package according to claim 6 wherein the plurality of conductive leads comprise a plurality of common signal leads, a plurality of dummy leads and a plurality of input/output leads, and wherein the structure comprises a conductive pattern that electrically connects at least two of the dummy leads along at least one selected portion of the tape carrier package between the first and second end portions thereof.

9. A flexible tape carrier package according to claim 6 further comprising at least one integrated circuit on the flexible base film, between the first and second end portions and electrically connected to at least some of the plurality of conductive leads.

10. A flexible tape carrier package that connects a Liquid Crystal Display (LCD) panel to a microelectronic substrate to form an LCD module, the flexible tape carrier package comprising:

a flexible base film that includes first and second opposing end portions that are configured to attach to the LCD panel and to the microelectronic substrate, respectively, and a plurality of conductive leads that extend to the first and second end portions, and that are configured to electrically connect to the LCD panel and to the microelectronic substrate, respectively;

wherein at least two of the conductive leads are electrically connected along at least one selected portion of the tape carrier package between the first and second end portions thereof.

11. A flexible tape carrier package according to claim 10 wherein the plurality of conductive leads comprise a plurality of common signal leads, and a plurality of input/output leads, and wherein at least two of the common signal leads are electrically connected along at least one selected portion of the tape carrier package between the first and second end portions thereof.

12. A flexible tape carrier package according to claim 10 wherein the plurality of conductive leads comprise a plurality of common signal leads, a plurality of dummy leads and a plurality of input/output leads, and wherein at least two of the dummy leads are electrically connected along at least one selected portion of the tape carrier package between the first and second end portions thereof.

13. A flexible tape carrier package according to claim 10 further comprising at least one integrated circuit on the flexible base film, between the first and second end portions and electrically connected to at least some of the plurality of conductive leads.

14. A Liquid Crystal Display (LCD) module, comprising:
an LCD panel;
a microeletronic substrate; and
flexible tape carrier package that connects the LCD panel to the microelectronic substrate, the flexible tape carrier package comprising:
a flexible base film that includes first and second opposing end portions that are attached to the LCD panel and to the microelectronic substrate, respectively, and a plurality of conductive leads that extend to the first and second end portions, and that electrically connect to the LCD panel and to the microelectronic substrate, respectively; and
means for selectively reinforcing the felxible tape carrier package;
wherein the means for selectively reinforcing comprises means for integrating at least two of the conductive leads along at least one selected portion of the tape carrier package between the first and second end portions thereof: and
wherein the plurality of conductive leads comprise a plurality of common signal leads, a plurality of dummy leads and a plurality of input/output leads, and wherein the means for integrating comprises means for integrating at least two of the common signal leads along at least one selected portion of the tape carrier package between the first and second end portions thereof.

15. An LCD module according to claim 14 wherein the plurality of conductive leads comprise a plurality of common signal leads, a plurality of dummy leads and a plurality of input/output leads, and wherein the means for integrating comprises means for integrating at least two of the dummy leads along at least one selected portion of the tape carrier package between the first and second end portions thereof.

16. An LCD module according to claim 15 further comprising at least one integrated circuit on the flexible base film, between the first and second end portions and electrically connected to at least some of the plurality of conductive leads.

* * * * *